(12) United States Patent
Forrest et al.

(10) Patent No.: US 9,666,816 B2
(45) Date of Patent: May 30, 2017

(54) GROWTH OF ORDERED CRYSTALLINE ORGANIC FILMS

(71) Applicant: The Regents of the University of Michigan, Ann Arbor, MI (US)

(72) Inventors: Stephen R. Forrest, Ann Arbor, MI (US); Richard R. Lunt, Okemos, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 14/570,261

(22) Filed: Dec. 15, 2014

(65) Prior Publication Data

US 2016/0155973 A1  Jun. 2, 2016

Related U.S. Application Data

(62) Division of application No. 12/197,195, filed on Aug. 22, 2008, now Pat. No. 8,912,036.
(Continued)

(51) Int. Cl.
*H01L 31/00* (2006.01)
*H01L 51/42* (2006.01)
(Continued)

(52) U.S. Cl.
CPC .......... *H01L 51/424* (2013.01); *B82Y 10/00* (2013.01); *C23C 14/12* (2013.01); *C23C 14/228* (2013.01);
(Continued)

(58) Field of Classification Search
CPC .......... H01L 51/0032; H01L 51/0034; H01L 51/0035; H01L 51/0036; H01L 51/0037; H01L 51/0038; H01L 51/0039; H01L 51/004; H01L 51/0041; H01L 51/0042; H01L 51/0043; H01L 51/0044; H01L 51/0045; H01L 51/0046; H01L 51/0047;
(Continued)

(56) References Cited

U.S. PATENT DOCUMENTS 5,612,536 A   3/1997  Torii et al.
6,105,225 A   8/2000  Torii et al.
(Continued)

FOREIGN PATENT DOCUMENTS

JP   H11274602   10/1999
JP   2002-076027   3/2002
(Continued)

OTHER PUBLICATIONS

Heutz, E. et al., J. Phys. Chem. B., 2005, 109, 11693-11696.*
(Continued)

*Primary Examiner* — Eli Mekhlin
(74) *Attorney, Agent, or Firm* — Finnegan, Henderson, Farabow, Garrett & Dunner LLP

(57) ABSTRACT

There is disclosed methods utilizing organic vapor phase deposition for growing bulk organic crystalline layers for organic photosensitive devices, heterojunctions and films made by such methods, and devices using such heterojunctions. There is also disclosed new methods for manufacturing heterojunctions and organic photosensitive devices, and the heterojunctions and devices manufactured thereby.

15 Claims, 9 Drawing Sheets

Related U.S. Application Data

(60) Provisional application No. 60/957,902, filed on Aug. 24, 2007.

(51) Int. Cl.
*B82Y 10/00* (2011.01)
*H01L 51/00* (2006.01)
*C23C 14/12* (2006.01)
*C23C 14/22* (2006.01)

(52) U.S. Cl.
CPC ...... H01L 51/0008 (2013.01); H01L 51/0013 (2013.01); *H01L 51/0046* (2013.01); *H01L 51/0053* (2013.01); *H01L 51/0078* (2013.01); *Y02E 10/549* (2013.01)

(58) Field of Classification Search
CPC ............. H01L 51/0048; H01L 51/0049; H01L 51/005; H01L 51/0051; H01L 51/0052; H01L 51/0053; H01L 51/0054; H01L 51/0055; H01L 51/0056; H01L 51/0057; H01L 51/0058; H01L 51/0059; H01L 51/006; H01L 51/0061; H01L 51/0062; H01L 51/0063; H01L 51/0064; H01L 51/0065; H01L 51/0067; H01L 51/0068; H01L 51/0069; H01L 51/007; H01L 51/0071

See application file for complete search history.

(56) References Cited

U.S. PATENT DOCUMENTS

| | | |
|---|---|---|
| 6,333,458 B1 | 12/2001 | Forrest et al. |
| 6,352,777 B1 | 3/2002 | Bulovic et al. |
| 6,420,031 B1 | 7/2002 | Parthasarathy et al. |
| 6,440,769 B2 | 8/2002 | Peumans et al. |
| 6,451,415 B1 | 9/2002 | Forrest et al. |
| 6,580,027 B2 | 6/2003 | Forrest et al. |
| 6,657,378 B2 | 12/2003 | Forrest et al. |
| 7,061,011 B2 | 6/2006 | Forrest et al. |
| 7,196,835 B2 | 3/2007 | Peumans et al. |
| 7,230,269 B2 | 6/2007 | Rand et al. |
| 2005/0110007 A1 | 5/2005 | Forrest et al. |
| 2005/0266218 A1 | 12/2005 | Peumans et al. |
| 2006/0027802 A1 | 2/2006 | Forrest et al. |
| 2006/0032529 A1 | 2/2006 | Rand et al. |

FOREIGN PATENT DOCUMENTS

| | | |
|---|---|---|
| JP | 2002-523904 | 7/2002 |
| JP | 2004-263241 | 9/2004 |
| JP | 2004-281786 | 10/2004 |
| JP | 2005-032917 | 2/2005 |
| WO | WO 00/11725 | 3/2000 |
| WO | WO 03/020999 | 3/2003 |
| WO | WO 2005/101524 | 10/2005 |

OTHER PUBLICATIONS

Gernho, Back et al., "Growth Mechanism of Highly Ordered Oriented Films of Copper(II)Phthalocyanine on Solid Substrates," Molecular Crystals and Liquid Crystals Science and Technology, vol. 327, pp. 147-152.

De Boer, B. et al., "Tuning of Metal Work Functions with Self-Assembled Monolayers,"Adv. Mater., 2005, vol. 17, No. 5, pp. 621-625.

Liu, S. et al., "Self-Organizing Liquid Crystal Perylene Diimide Thin Films: Spectroscopy, Crystallinity, and Molecular Orientation," J. Phys. Chem. B, 2002, vol. 106, 1307-1315.

Heutz, E. et al., "Charge Recombination in CuPc/PTCDA Thin Films," J. Phys. Chem. B., 2005, vol. 109, pp. 11693-11696.

Chen, W. et al., "Tuning the hole injection barrier at the organic/metal interface with self-assembled functionalized aromatic thiols. Journal of Physical Chemistry," B, vol. 110, Nov. 23, 2006, pp. 26075-26080.

International Search Report for PCT Application Serial No. PCT/US08/74120, mailed on Dec. 11, 2008.

Kunstmann, T. et al., "Dynamic force microscopy study of 3,4,9,10 perylenetetracarboxylic dianhydride on KBr(001)". Physical Review B, vol. 71, Mar. 15, 2005, pp. 121403-1-121403-4.

Lunt, R. et al., "Real-time monitoring of organic vapor-phase deposition of molecular thin films using high-pressure reflection high-energy electron diffraction". Applied Physics Letters, AIP, American Institute of Physics, Melville, NY, vol. 90, No. 18, May 4, 2007, pp. 181932-1 to 181932-3.

Miessler G.L. et al., 1999 Chapter 1 "Introduction to Inorganic Chemistry", $2^{nd}$ Edition, Chapter 1, Introduction to Inorganic Chemistry, pp. 1-3; Chapter 13, Organometallic Chemistry, pp. 422-424, 442 of Inorganic Chemistry. Upper Saddle River, NJ: Prentice-Hall, 1999 (Aug. 1999 Reprinted Edition).

Mobus, M., et al., "Structure of perylene-tetracarboxylic-dianhydride thin films on alkali halide crystal substrates". Journal of Crystal Growth, vol. 116, Issues 3-4, Feb. 1, 1992, pp. 495-504.

Peumans P. et al., 2000 American Institute of Physics, "Efficient photon harvesting at high optical intensities in ultrathin organic double-heterostructure photovoltaic diodes". Applied Physics Letters, vol. 76, No. 19, May 8, 2000, pp. 2650-2652.

Rusu, et al., "Organic donor, acceptor and buffer layers of small molecules prepared by OVPD technique for photovoltaics." Renewable Energy, Pergamon Press, Oxford, GB, vol. 33, No. 2, Jul. 2007, pp. 254-258.

Shtein, M. et al., 2001. "Material transport regimes and mechanisms for growth of molecular organic thin films using low-pressure organic vapor phase deposition." Journal of Applied Physics. vol. 89, No. 2 (Jan. 15, 2001), pp. 1470-1476.

Shtein, M. et al., 2002. "Effects of film morphology and gate dielectric surface preparation on the electrical characteristics of organic vapor phase deposited pentacene thin-film transistors". Applied Physics Letters. vol. 81, No. 2 (Jul. 8, 2002), pp. 268-270.

Yang, F., et al., "Controlled Growth of Molecular Bulk Heterojunction Photovoltaic Cell." Nature Materials, Nature Publishing Group, London, GB, vol. 4, No. 1; Jan. 1, 2005, pp. 37-41.

\* cited by examiner

GROWTH OF ORDERED CRYSTALLINE ORGANIC FILMS

This application is a divisional of, and claims the benefit of priority to, application Ser. No. 12/197,195, filed Aug. 22, 2008, now U.S. Pat. No. 8,912,036, which claims the benefit of U.S. provisional application No. 60/957,902 filed Aug. 24, 2007. The contents of both applications are incorporated herein by reference.

This invention was made with U.S. Government support under Contract No. FA9550-07-1-0364 awarded by the Air Force Office of Scientific Research. The government has certain rights in this invention.

The present invention generally relates to organic photosensitive films for use in electronic devices, to processes for manufacturing such films, and to devices using such films.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. As used herein, the term "rectifying" denotes, inter alia, that an interface has an asymmetric conduction characteristic, i.e., the interface supports electronic charge transport preferably in one direction. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, (2) the photovoltage under open circuit conditions, i.e., the open circuit voltage $V_{OC}$, and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as: $ff=(I_{max} V_{max})/(I_{SC} \times V_{OC})$ (1) where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by: $\eta_P=ff \times (I_{SC} \times V_{OC})/P_{inc}$.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

Organic PV cells have many potential advantages when compared to traditional silicon-based devices. Organic PV cells are lightweight, economical in materials use, and can be deposited on low cost substrates, such as flexible plastic foils.

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

Despite the many advantages of organic PV devices, they typically have relatively low external quantum efficiency, on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EQE for external quantum efficiency, A for photon absorption, ED for exciton diffusion, CC for charge collection, and IQE for internal quantum efficiency. Using this notation, $\eta_P \sim \theta_{EQE} = \eta_A \times \eta_{ED} \times \eta_{CC}$, and $\eta_{EQE} = \eta_A \times \eta_{IQE}$.

The progress in increasing the power conversion efficiency ($\eta_P$) of organic photovoltaic (PV) cells over the last decade is chiefly attributed to the introduction of the donor-acceptor (DA) heterojunction which functions as a dissociation site for strongly bound photogenerated excitons. Typically, in bilayer DA PV cells with a total thickness, L, on the order of the optical absorption length, $L_A$, the absorption efficiency is $=1-\exp(-L/L_A)>50\%$, if optical interference effects are ignored, and $\eta_A \approx 100\%$. However since the exciton diffusion length ($L_D$) in highly disordered organic materials is typically an order of magnitude smaller than $L_A$, a large fraction of the photogenerated excitons remains unused for photocurrent generation (FIG. 2A), limiting $\eta_{EQE}$, and hence $\eta_P$, for this type of cell. The exciton diffusion bottleneck has been partially removed through the introduction of bulk heterojunctions (FIG. 2B). In a bulk heterojunction, the DA interface is highly folded and interdigitated such that photogenerated excitons always find a DA interface within a distance $L_D$ of their generation site. Currently, state-of-the-art bulk heterojunction polymer PV cells have power conversion efficiencies exceeding 5%. A polymer bulk heterojunction is typically fabricated by spin-coating a mixture of soluble versions of the donor and acceptor materials. During spin-coating and solvent evaporation, the donor and acceptor materials phase separate, creating an intricate network. However, this type of cell has a disadvantage in that the diffusion length ($L_D$) of an exciton is typically much less ($L_D \sim 50$ Å) than the optical absorption length (~500 Å), requiring a trade off between using a thick, and therefore resistive, cell with multiple or highly folded interfaces, or a thin cell with a low optical absorption efficiency. The high series resistance of these bulk heterojunction amorphous organic blends limits the active layer thickness, leading to reduced light absorption, while exhibiting low fill factor and hence low solar energy conversion efficiency.

However, the absorption efficiency of bulk heterojunctions are spatially limited. In general, the absorption characteristics of a heterojunction are maximized by selecting donor materials and acceptor materials with different absorption spectra. If an incident photon has a wavelength near an absorption peak of the first material but not the second material, and the incident photon transits through the bulk heterojunction predominantly via the second material (e.g., passing down the length of a "finger" of the second material), there is a reduced likelihood that the photon will contribute to photocurrent.

Thus, it would be beneficial to retain the advantages of an ordered bulk heterojunction, such as the short distances for excitons to travel before disassociation, while further increasing photon-to-exciton conversion by increasing the donor-acceptor interface area where excitons disassociate and overall layer thickness.

One means to addressing the low mobility of charge carriers in disordered organic films is to deploy processing approaches that create order and crystallinity in the organic materials. U.S. patent application Ser. No. 11/880,210 incorporated herein by reference, provides one such means, providing a PV cell in which the active layer is comprised of nanocrystalline organic regions forming high conductivity networks for charge extraction. This cell retains many of the benefits imparted by the use of crystalline materials, including lowered resistance, combined with the high surface area of bulk heterojunctions.

SUMMARY OF THE INVENTION

New methods utilizing organic vapor phase deposition for growing bulk organic crystalline layers for organic photosensitive devices, heterojunctions and films made by such methods, and devices using such heterojunctions and films are disclosed. In addition, new methods for manufacturing heterojunctions and organic photosensitive devices, and the heterojunctions and devices manufactured thereby, are also disclosed.

For example, in one embodiment, there is disclosed a method of forming a layer used in an organic photosensitive optoelectronic device, comprising: providing a substrate; and growing a crystalline layer of a first organic material on the substrate by organic vapor phase deposition. This method has been used to form a crystalline layer having a crystallinity of long range order, such as at least about 0.25 cm$^2$.

In another embodiment, there is disclosed an organic photosensitive device comprising at least one layer made according to the disclosed method, such as a layer comprising a substrate, having a crystalline material of a first organic material having a long range crystallinity order.

In yet another embodiment, there is disclosed a method for forming a heterojunction for an organic photosensitive device, comprising:

growing a first crystalline layer of a first organic material on a substrate, wherein the substrate is maintained at a temperature ranging from −100° C. to about 200° C., such as −40° C. to about 90° C.;

growing a second oriented and crystalline layer of a second organic material on the surface of the first layer; and wherein the first crystalline layer is an acceptor or donor material and the second crystalline layer is the opposite of the first crystalline layer.

The accompanying drawings, which are incorporated in and constitute a part of this specification, illustrate several embodiments of the invention and, together with the description, serve to explain the principles of the invention. The figures are not necessarily drawn to scale.

DETAILED DESCRIPTION

Figure 1:
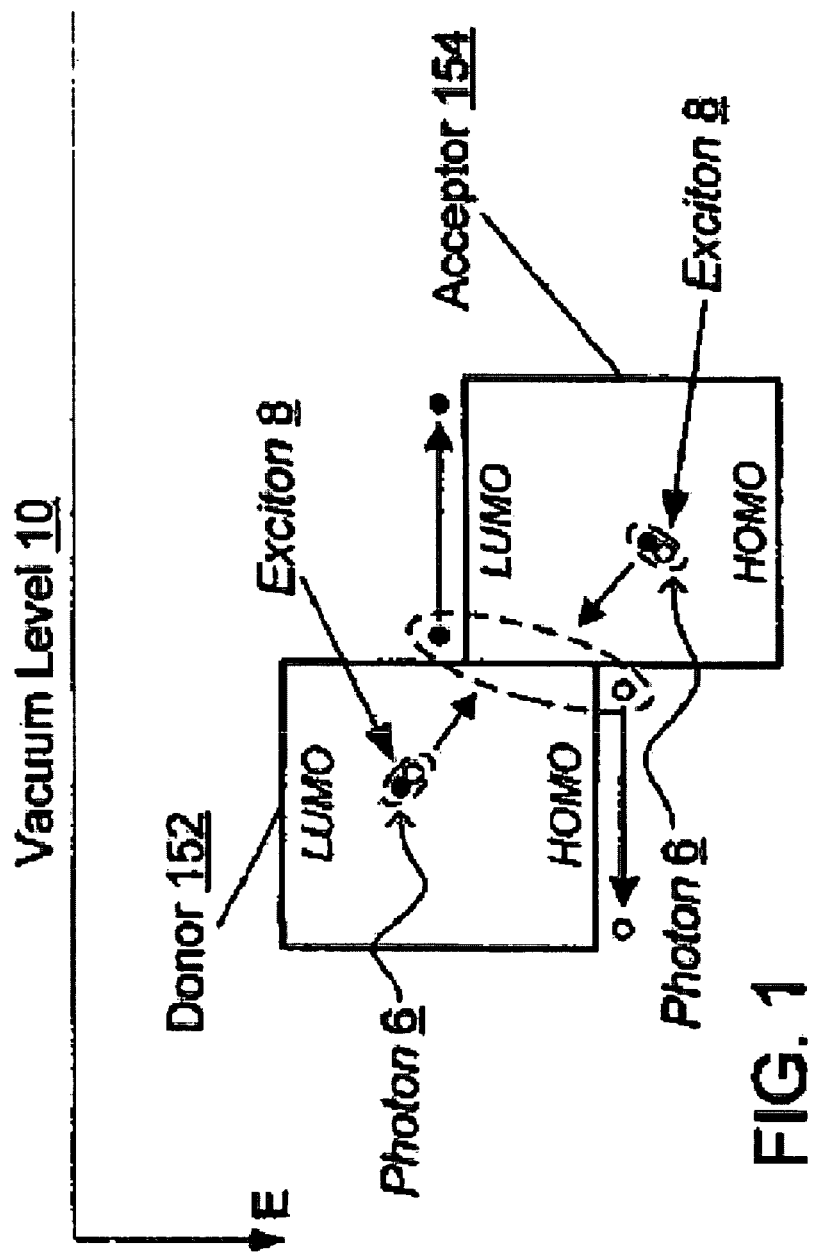
FIG. 1 is an energy level diagram illustrating a donor-acceptor heterojunction.
Figure 2A:
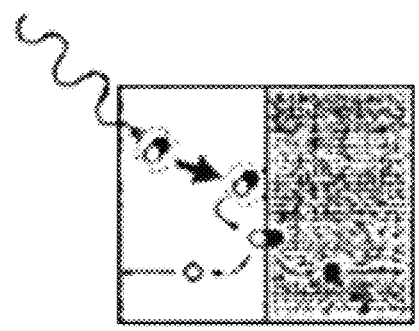
FIG. 2A and FIG. 2B illustrate two types of donor-acceptor organic photovoltaic cells.
Figure 2B:
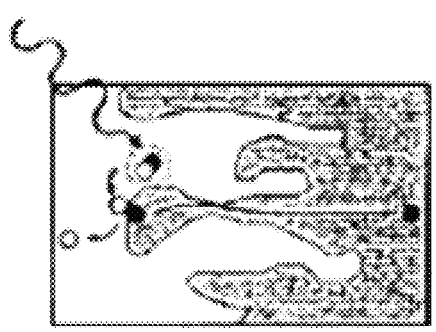

Thus, in one embodiment, there is disclosed a method of forming a layer in an organic photosensitive optoelectronic device, comprising: providing a substrate; and growing a thick crystalline layer of a first organic material on the substrate by organic vapor phase deposition, wherein said crystalline layer has crystallinity of long range order, such as at least 0.25 cm$^2$, at least 1.0 cm$^2$, or at least 4.0 cm$^2$. The crystalline layer is at least about 150 Å thick, such as at least about 400 Å thick.

In one embodiment, the method further comprising depositing a crystalline layer of a second organic material on the substrate, which may comprise an alkali-halide material. In one embodiment, the alkali-halide material comprises KBr. In another embodiment, the substrate comprises highly oriented pyrolytic graphite. In one embodiment, the disclosed substrate is maintained at a temperature ranging from −40° C. to 90° C. during organic vapor phase deposition.

In one embodiment, the disclosed method further comprising depositing a self assembled monolayer prior to growing said crystalline layer of a first organic material on the substrate. In one embodiment, the self assembled monolayer comprises an alkanethiol.

It is understood that the first organic material may comprise a small molecule or polymeric material. Non-limiting examples of the small molecule material include PTCDA and CuPc. In one embodiment, the first organic material comprises CuPc, and the second organic material comprises PTCDA.

There is also disclosed an organic photosensitive device comprising at least one layer as disclosed herein, e.g., comprising a substrate, said substrate comprising a crystalline material of a first organic material, wherein the crystalline material has a long-range crystallinity order.

In one embodiment, the organic photosensitive device comprises at least one layer described herein that forms a heterojunction. There is also disclosed a method of forming a heterojunction for an organic photosensitive device. The method typically comprises growing a first crystalline layer of a first organic material on a substrate, wherein the substrate is maintained at a low temperature, such as one ranging from −40° C. to about 90° C.; growing a second oriented and crystalline layer of a second organic material on the surface of the first layer; wherein the first crystalline layer is an acceptor or donor material and the second crystalline layer is the opposite of the first crystalline layer.

In this embodiment, the method may comprise depositing a self-assembled monolayer on the substrate prior to growing the first crystalline layer.

In another embodiment, the substrate is a stamp substrate and the method further comprises pressing the first and second crystalline layers and the self-assembled monolayer onto a first electrode. This embodiment may further comprise removing the stamp substrate and the self-assembled monolayer; and depositing an exciton blocking layer over the first crystalline layer. In addition, this method may further comprise depositing a second electrode over the exciton blocking layer.

As stated, in one embodiment, the first crystalline layer may comprise CuPc and the second crystalline layer may comprise $C_{60}$. In another embodiment, the first crystalline layer may comprise CuPc and the second crystalline layer may comprise PTCDA.

In one embodiment, organic vapor phase deposition (OVPD) is used as the primary means for the growth of crystalline organic films. OVPD differs from previously used vacuum techniques in that the organic molecules are evaporated into a hot, inert carrier gas which transports them through a hot walled reactor portion (to prevent deposition on the furnace itself) to a cooled substrate.

OVPD is different from the widely used vacuum thermal evaporation (VTE) in that OVPD uses a carrier gas to transport vapors into a deposition chamber. Spatially separating the functions of evaporation and transport leads to precise control over the deposition process, and enabling control over the organic surface morphology, e.g., flat with smooth surface or layers with protrusions. Another feature of OVPD, compared with VTE, is the large molecular surface diffusivity and the non-ballistic trajectories followed by the molecules in their arrival at the surface. OVPD is particularly effective at filling preexisting voids and other surface non-uniformities, whereas VTE is ineffective due to the long mean free paths and ballistic trajectories followed by incident molecules.

At typical deposition conditions used in OVPD, the flow of the carrier gas around the substrate creates a hydrodynamic boundary layer where molecular transport is diffusion-limited. The deposition rate, deposition efficiency, and film morphology are controlled by adjusting the organic species concentration, flow hydrodynamics, and surface diffusivity.

In addition to improvements in carrier mobility, series resistance, and overall efficiency over spin-coat designs, the ordered nature of OVPD-grown heterojunctions can eliminate the occurrence of pockets of donor and acceptor material not electrically connected by a percolation pathway to an electrode.

A further advantage of OVPD over VTE is that (1) it is capable of depositing over very large substrate areas, and (2) it provides considerable control over crystalline morphology due to the ability to vary both ambient pressure and substrate temperature. Indeed, ambient gas pressure controls the surface mobility of adatoms, thereby resulting in control of surface texture as well as long range crystalline order.

Crystalline layers have drastically higher mobilities compared to their disordered counterparts (about $10^4$ to about $10^6$ times higher), thus leading to significant increases in the exciton diffusion length, layer conductivity, and resultantly, usable layer thickness and absorption efficiency. However, long range order of crystallinity in organic films is extremely difficult to achieve by methods other than the OVPD process described herein; thus, achieving layers with such drastically higher mobilities has been elusive in the past. Since $\eta_{EQE}$ depends on the product of individual efficiencies which are all dependent on charge mobility, achieving high crystallinity in the manner set forth herein may have a dramatic effect on the power conversion efficiency of a cell which uses such crystalline films. Finally, crystallinity over large areas should lead to more stable materials by avoiding metastable mixtures as represented by the bulk heterojunction architecture, leading to PV cells with practical operational lifetimes. Taken together, high efficiency cells with areas >4 cm$^2$ can then be generated at low cost using the lightweight, flexible substrates afforded by the low processing temperatures characteristic of organic thin film materials.

In one embodiment, layers are "thick", in that they are extended into their bulk forms, and hence, continued growth of additional material would not change the crystalline habits or morphologies of the layers. In another embodiment, layers are at least about 150 Å in thickness. In a further embodiment, layers are at least about 400 Å in thickness.

At least one formed layer should have long range crystalline order, such as crystalline order of at least about 0.25 cm$^2$ (0.5 cm by 0.5 cm), or at least about 1.0 cm$^2$ (1.0 cm by 1.0 cm), or even at least about 4.0 cm$^2$ (2.0 cm by 2.0 cm).

In one embodiment at least one layer is oriented in the same direction as an adjacent layer.

In one embodiment, small molecule organic materials are used to make at least one layer. Non-limiting examples of such materials include CuPc, PTCDA, and $C_{60}$.

In one embodiment the substrate temperature in the OVPD is kept low, for example, at a temperatures ranging from −40° C. to 90° C., or −40° C. to 25° C.

Examples of EBLs are described in U.S. Pat. Nos. 6,451,415 and 7,230,269 to Forrest et al., which are incorporated herein by reference for their disclosures related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

Figure 8:
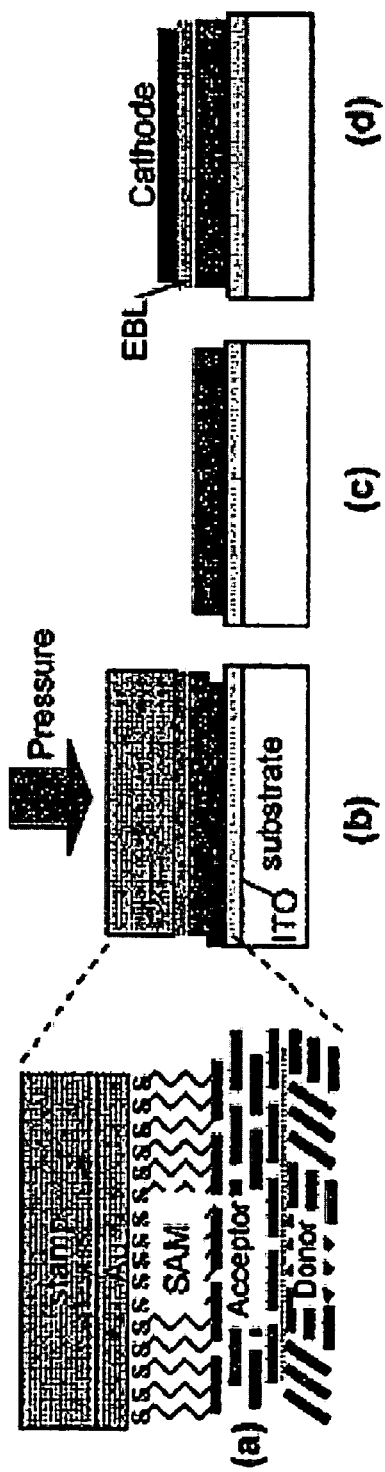
FIG. 8 illustrates an alternative process having steps (a) through (d) for making a heterojunction.

A substrate may be any suitable substrate that provides desired structural properties. The substrate may be flexible or rigid, planar or non-planar. In some embodiments, alkali halide substrates are employed, such as KBr. In another embodiment, pyrolytic graphite and oriented pyrolytic graphite are also employed. In some embodiments, the substrate may comprise a thick crystalline layer of an organic material. The substrate may be transparent, translucent or opaque. Rigid plastics and glass are examples of rigid substrate materials. Flexible plastics and metal foils are examples of flexible substrate materials. As illustrated in FIG. 8, a self assembled monolayer cast onto a coinage metal, e.g., Au, Ag, may be used as a substrate. In one embodiment, the SAM comprises an alkanethiol. In another embodiment, a SAM is selected such that the bond strength between a film and anode (or an ITO coated anode, as illustrated in FIG. 8) is stronger than the film and a selected SAM, so as to facilitate transfer of a film from a SAM coated substrate.

An anode-smoothing layer may be situated between an anode layer and a layer of a heterojunction, such as a donor layer. Anode-smoothing layers are described in U.S. Pat. No. 6,657,378 to Forrest et al., incorporated herein by reference for its disclosure related to this feature.

Cells manufactured in accordance with the described embodiments may comprise additional organic layers that may be fabricated using vacuum deposition, spin coating, solution processing, organic vapor-phase deposition, inkjet printing, organic vapor jet printing and other methods known in the art. Organic materials may include organometallic compounds, including cyclometallated organometallic compounds.

Figure 9:
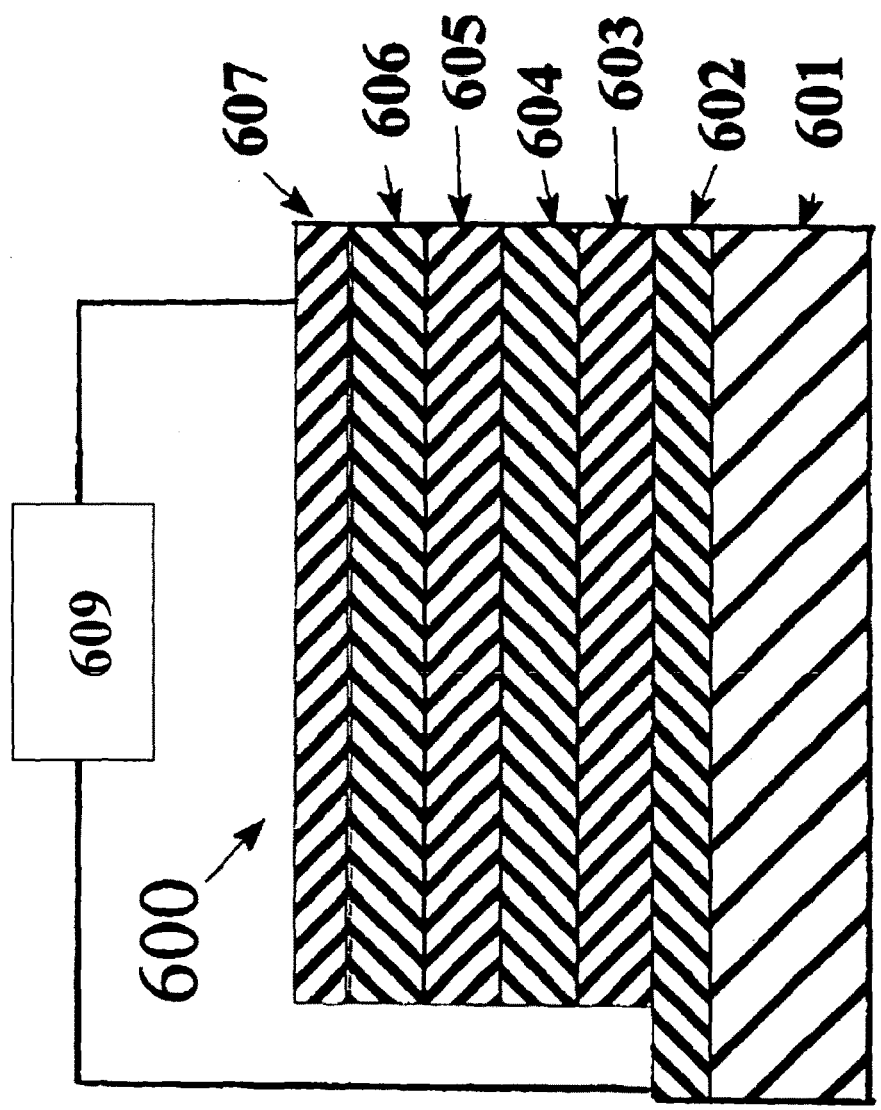
FIG. 9 is a schematic of a tandem cell.

A cell as illustrated in FIG. 9 may be connected to an element 608. If the device is a photovoltaic device, the element is a resistive load which consumes or stores power. If the device is a photodetector, element 608 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 608 is a signal detection circuit to monitor changes in resistance across the device due to the absorption of light. Unless otherwise stated, each of these arrangements and modifications may be used for the devices in each of the drawings and embodiments described herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

In each of the devices described above, layers may be omitted, such as the smoothing layer and the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in Published US Patent Application No. 2005-0266218 A1, entitled "Aperiodic dielectric multilayer stack" by Peumans et al., U.S. Pat. No. 7,196,835, which is incorporated herein by reference. In the tandem devices, transparent insulative layers may be formed between cells, with the electrical connection between the cells being provided via electrodes. Also in a tandem cell, one or more of the photoactive regions may be a Schottky-barrier heterojunction instead of a donor-acceptor heterojunction. Arrangements other than those specifically described may be used.

DEFINITIONS

Electrodes, such as anodes and cathodes, may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

As used herein, the term "organic" includes polymeric materials as well as small molecule organic materials that may be used to fabricate organic optoelectronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

The term "highly oriented pyrolytic graphite" refers to a graphite material having a mosaic spread of less than 1 degree.

The term "long range order" as used herein generally refers to the order observed across a substrate of at least 1 square micron, or even several square microns (um²), or in some cases, at least 0.5 mm².

Examples

Specific examples of the invention are illustrated and/or described herein. However, it will be appreciated that modifications and variations of the invention are covered by the above teachings and within the purview of the appended claims without departing from the spirit and scope of the invention.

General OVPD Process

Figure 3:
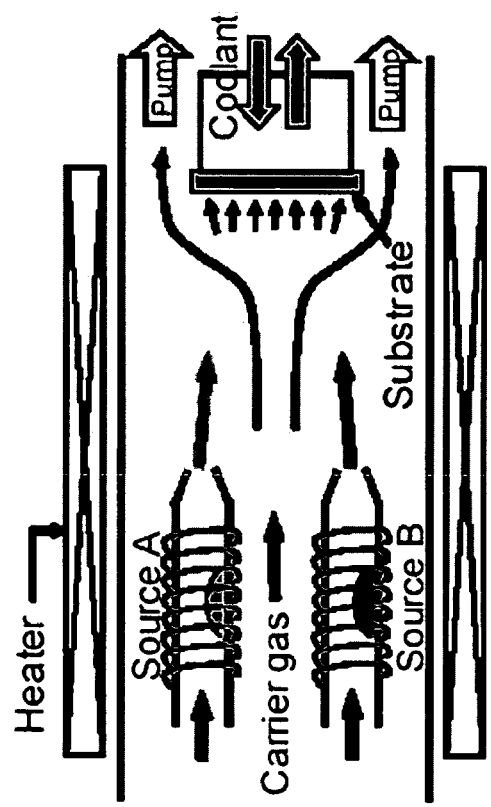
FIG. 3 is an illustration of an OVPD process.

A non-limiting example of an OVPD system schematic is shown in FIG. 3. In OVPD a hot inert carrier gas 1 is infused with an evaporated organic 2 which emanates from source cell 3. The organic 2 is transported to a cooled substrate 4 where deposition occurs, thus forming film 5. Gas temperature, substrate temperature, and gas pressure can be varied to affect the crystallinity of film 5.

In one embodiment, in situ diagnostics can be used to monitor the crystallinity of the film 5, such as reflection high energy electron diffraction (RHEED), a technique which is commonly used in ultrahigh vacuum systems such as organic molecular beam deposition (OMBD).

A non-limiting example of the ability of OVPD to achieve long range crystalline order is demonstrated by the growth of an archetype molecular crystal of 3,4,9,10 perylenetet-racarboxylic dianhydride (PTCDA) on a single crystal of KBr. Growth was carried out in a vertical, multibarrel quartz OVPD chamber described previously. See Shtein et al., *J. Appl. Phys.*, vol. 89, p. 1470 (2001), incorporated herein by reference. Crystal structure was monitored in situ and in real-time with HP-RHEED (see Lunt et al., *Appl. Phys. Lett.*, 2007, 70, incorporated herein by reference), and ex situ with x-ray diffraction in the Bragg-Brentano configuration using a Rigaku Cu-Kα rotating anode source. HP-RHEED patterns using a 0.1×20 mm² electron beam were recorded at a beam energy, current, and incident angle of 20 keV, <100 nA, and ~1°, respectively. Beam current was minimized to avoid charging at >100 nA. Film thickness was measured post-growth using a variable-angle spectroscopic ellipsometer on solvent-cleaned Si substrates. Surface topography was observed using scanning electron microscopy (SEM) after coating the surface with 20 Å of Au to prevent charging.

PTCDA was twice purified by gradient sublimation prior to loading into a quartz source boat located in a barrel of the OVPD chamber. PTCDA was evaporated at 385° C. at a 25 sccm nitrogen flow, corresponding to a nominal deposition rate of 0.7 Å/s at a growth pressure of 60 mTorr. Single crystal KBr substrates were cleaved immediately prior to being loaded into the growth chamber.

To index the HP-RHEED patterns, the d-spacings were calculated for each assigned streak location, calibrated using the KBr pattern. X-ray diffraction was used to determine the stacking direction of the film to help identify in-plane surface meshes. Lattice constants were fit to the d-spacings, and assigned indices using a non-linear least squares regression of all the data.

Figure 4A:
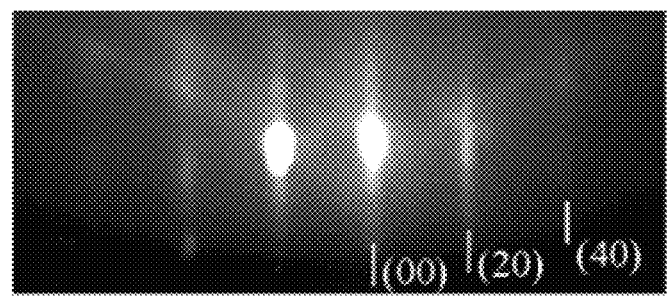
FIG. 4A illustrates reflection high energy electron diffraction (RHEED) patterns for a bare KBr substrate with the electron beam pointed in the [100] direction.

FIG. 4A depicts a RHEED pattern for a bare KBr substrate with the electron beam oriented in the [100] direction.

Figure 4B:
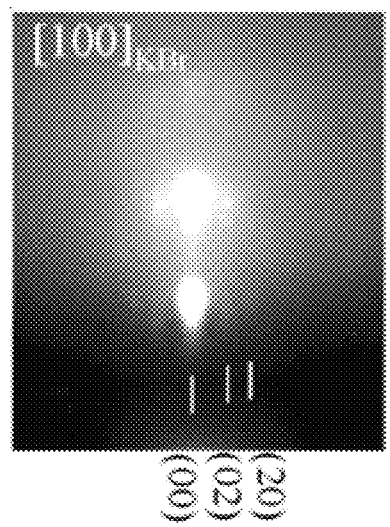
FIG. 4B and FIG. 4C illustrate RHEED patterns along two different KBr substrate orientations for an approximately 40 nm layer thick PTCDA layer grown on its surface.
Figure 4C:
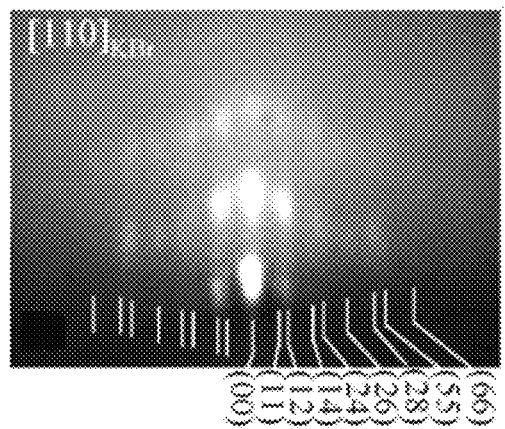

The resulting RHEED pattern of a 400 Å thick PTCDA film are shown in FIG. 4B and FIG. 4C along two KBr crystalline directions. Streak locations are highlighted with white tick marks. The well defined and continuous streaks in the RHEED pattern indicate a flat and well ordered structure over the length of the probing electron beam, or over approximately 0.1 mm×2 cm. The measured d-spacings for FIG. 4B are (02), (20)=9.7 Å, 6.0 Å, respectively. The measured d-spacings for FIG. 4C are (11), (12), (14), (24), (26), (28), (55), (66)=10.4 Å, 7.9 Å, 4.7 Å, 3.9 Å, 2.96 Å, 2.29 Å, 2.10 Å, 1.72 Å, respectively. Indexing of the streaks (as indicated by the short white lines with unit mesh indices noted) clearly indicates that PTCDA is growing in its relaxed α-phase. Furthermore, the variation of streak pattern along the (110) and (100) KBr directions clearly shows a preferred alignment to the underlying crystal. This is remarkable since there is no apparent lattice match between the PTCDA and KBr structures, where the strain exceeds 5%. This ability to grow ordered, but relaxed molecular crystals on substrates without matching is believed to be a direct result of the "soft" van der Waals bonds characteristic of organic materials. This property has been studied extensively in laboratories around the world, and is known as "quasi-epitaxy". Of particular note is the nearly perfect alignment over such a large, macroscopic region for this particular film/substrate combination. The overall dimensions of the ordered PTCDA film were 12 mm×25 mm, and the film was about 1 mm thick. It is believed that this degree of film crystal perfection has not been observed for a thick film over such large dimensions.

Figure 5:
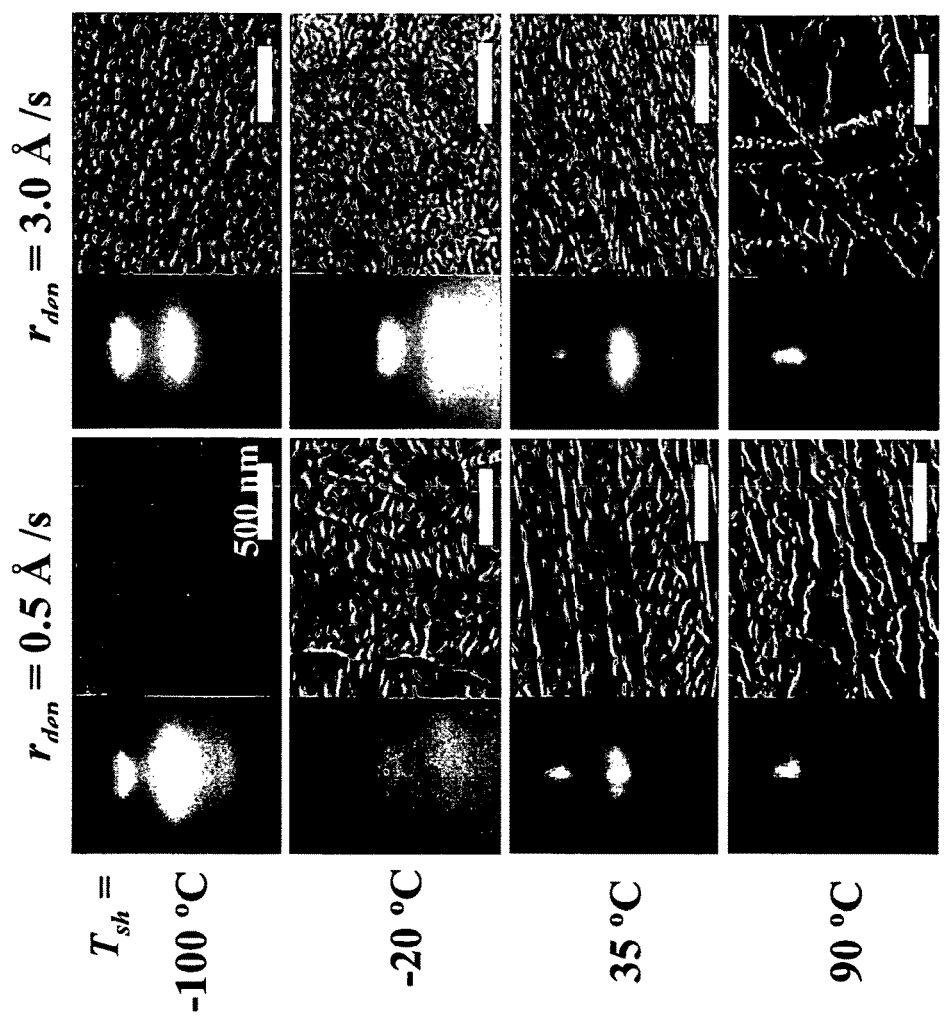
FIG. 5 illustrates scanning electron microscope (SEM) images and corresponding RHEED patterns of 40 nm thick films of CuPc grown on highly oriented pyrolytic graphite (HOPG) as a function of temperature and reaction rate. The white scale bar corresponds to 500 nm.

In FIG. 5 is shown a matrix of substrate temperatures and background reactor pressures on the crystalline morphology of a donor material, copper phthalocyanine (CuPc) grown on highly oriented pyrolytic graphite (HOPG). There is clearly a significant degree of control over crystal parameters over the range of growth parameters. Again, quasi-epitaxial alignment of film to substrate is observed under some growth conditions.

Figure 6:
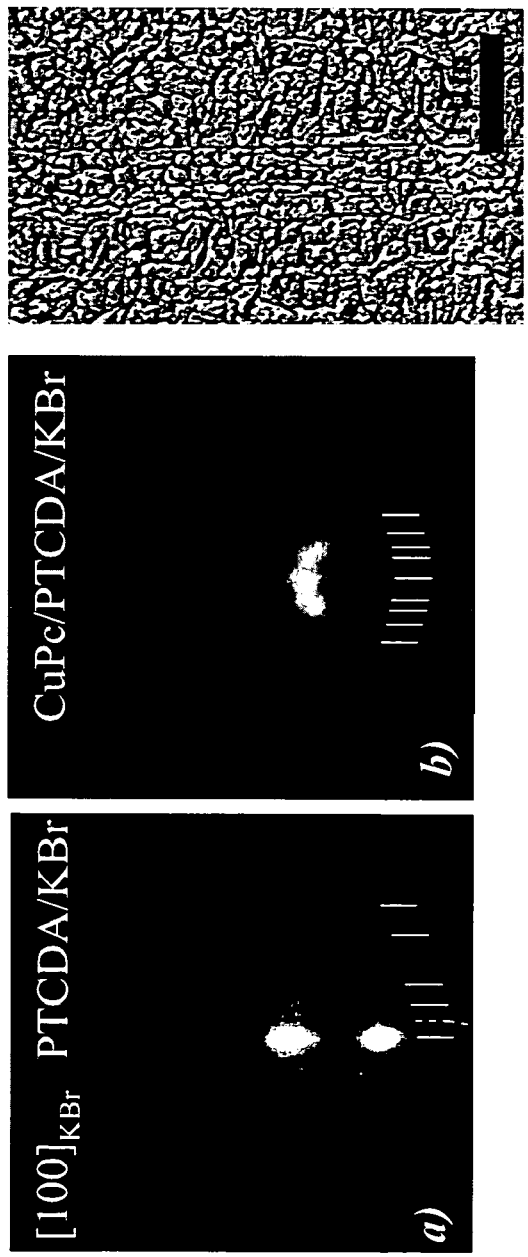
FIG. 6 on the left illustrates a RHEED pattern along the [100] KBr direction for a first 40 nm thick layer of PTCDA. In the middle is illustrated the RHEED pattern for 15 nm thick CuPc grown on the PTCDA layer. On the right is illustrated the surface morphology of the bilayer showing complete coverage but with an "orange peel" surface morphology.

In another non-limiting example, a crystalline layer of a first organic, PTCDA, was grown on a substrate, KBr, followed by the growth of a second oriented and crystalline layer of a second organic material, CuPc, on the surface of the PTCDA. The RHEED patterns and morphology of the first and second layers are shown in FIG. 6. Both layers are "thick" in that they are extended into their bulk forms, and hence, continued growth of additional material would not change the crystalline habits or morphologies of the layers. The PTCDA layer has a thickness of 40 nm, and the CuPc layer has a thickness of 15 nm. It is believed that this is the first demonstration of the growth of a bulk crystalline organic material on top of another, forming a fully ordered planar heterojunction (hereinafter, an "organic crystalline planar heterojunction")

Figure 7:
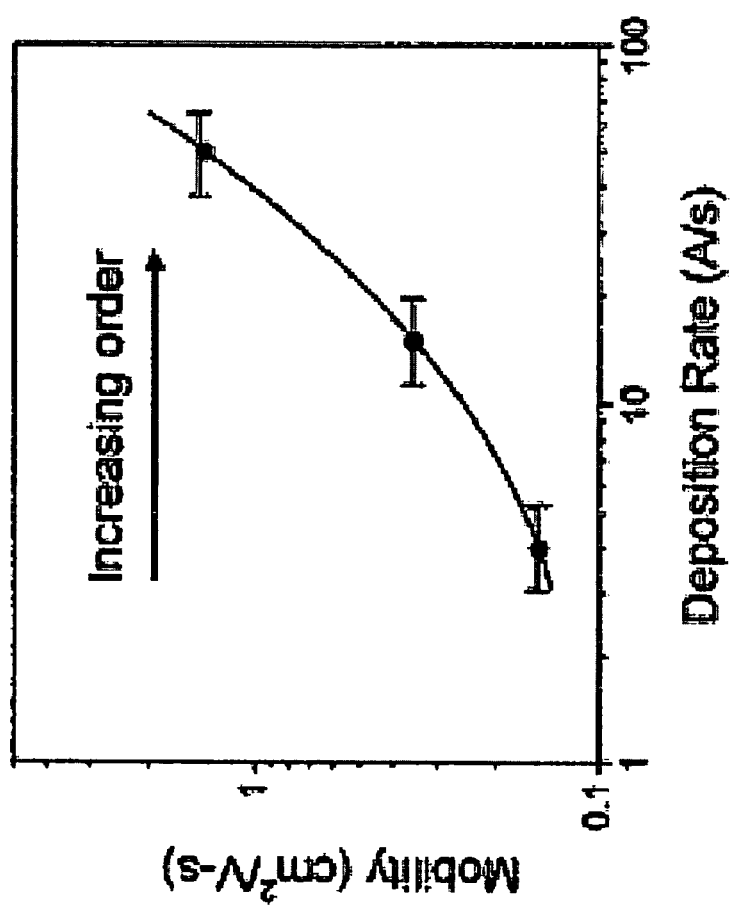
FIG. 7 depicts the hole mobility of 100 nm thick films of PTCDA deposited at various growth rates.

The above examples clearly indicate that films having long range order of crystallinity can be achieved using small molecule organic materials under the favorable growth conditions afforded by OVPD. Furthermore, charge mobility is a strong function of order. As shown in FIG. 7, hole mobility in PTCDA is shown as a function of growth rate. FIG. 7 demonstrates that mobility increases by two orders of magnitude, reaching a maximum of 1.5 cm²/(V·s) at a rate of 50 Å/s when grown in ultrahigh vacuum. This increased mobility has also been observed in pentacene grown by OVPD. See M. Shtein, J. Mapel, J. B. Benziger, and S. R. Forrest, "Effects of film morphology and gate dielectric surface preparation on the electrical characteristics of organic vapor phase deposited pentacene thin-film transistors", *Appl. Phys. Lett.*, vol. 81, p. 268 (2002), herein incorporated by reference. Hence, such heterojunctions in PV cells, including organic crystalline planar heterojunctions, should be expected to have very high power conversion efficiencies.

General Method for Manufacturing a PV Cell

In accordance with another embodiment, an exemplary method of manufacturing a PV cell is provided comprising the steps of: a) deposition, by OVPD, of the donor-acceptor heterojunction on a stamp with a pre-deposited self assembled monolayer (SAM) on Au to form the growth template; b) transfer by stamping the crystalline heterojunction onto an indium tin oxide (ITO) coated substrate; c) thus, forming a complete heterojunction, upon which; d) an exciton blocking layer (EBL) and a metal cathode is deposited to complete the cell. Details of this non-limiting process are depicted in FIG. 8(*a*) through FIG. 8(*d*), respectively.

By repeating process steps as depicted in FIG. 8(*a*) and FIG. 8(*b*), more complex cells, such as the exemplary tandem (or "stacked") device depicted in FIG. 9, may be formed. A non-limiting example of a organic photosensitive optoelectronic cell with multiple organic layers, or a multilayer device 600, is shown in FIG. 9. Insulating or conducting substrate 601 supports the device. First electrode 602 comprises, e.g., ITO of an appropriate thickness. The non-limiting exemplary device also includes organic layers 603, 604, 605, and 606. Finally, second transparent electrode 607 is adjacent to organic layer 606.

In a tandem cell, heterojunctions having various layer thicknesses may be stacked to optimize the absorption of various wavelengths of light. In one embodiment, a tandem cell is formed by first forming at least a heterojunction as depicted in FIG. 8(*c*), wherein the substrate used is transparent glass, wherein the anode on the substrate is ITO, and wherein the heterojunction (or heterojunctions, such as a double heterojunction) has layer thicknesses which selectively absorb red light. Next, a second heterojunction is stamped upon the first heterojunction, where in the second heterojunction has layer thicknesses which preferably absorb blue light. Last, a cathode is deposited on the second heterojunction (much as depicted in FIG. 8(*d*)), and the tandem cell is completed.

Transparent charge transfer layers, electrodes, or charge recombination zones may also be included in a tandem cell. For example, a silver nanoparticle layer (not depicted) may be used between the first heterojunction and the second heterojunction to intensify the optical field in adjacent absorbing layers, while simultaneously acting as recombination sites for photogenerated electrons and holes.

The examples set forth above set forth exemplary embodiments of the invention, but unless expressly specified, are not intended to set limits on the invention.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention.

Specific examples of the invention are illustrated and/or described herein. However, it will be appreciated that modifications and variations of the invention are covered by the above teachings and within the purview of the appended claims without departing from the spirit and scope of the invention.

What is claimed is:

1. An organic photosensitive device comprising at least one layer on a substrate, said layer comprising a crystalline material of a first organic material, wherein said crystalline material has crystallinity of long range order of at least about 0.25 cm$^2$.

2. The organic photosensitive device of claim 1, wherein the crystalline material is at least 150 Å thick.

3. The organic photosensitive device of claim 1, wherein the organic photosensitive device further comprises a crystalline layer of a second organic material.

4. The organic photosensitive device of claim 3, wherein the first organic material comprises copper phthalocyanine (CuPc), and the second organic material is chosen from 3,4,9,10-perylenetetracarboxylic dianhydride (PTCDA) and $C_{60}$.

5. The organic photosensitive device of claim 3, wherein the crystalline layer of the first organic material and the crystalline layer of the second organic material form a donor-acceptor heterojunction.

6. The organic photosensitive device of claim 1, wherein the substrate comprises an alkali-halide material.

7. The organic photosensitive device of claim 6, wherein the alkali-halide material comprises KBr.

8. The organic photosensitive device of claim 1, further comprising a self assembled monolayer between the substrate and the crystalline material.

9. The organic photosensitive device of claim 8, wherein the self assembled monolayer comprises an alkanethiol.

10. The organic photosensitive device of claim 1, wherein the substrate comprises highly oriented pyrolytic graphite.

11. The organic photosensitive device of claim 1, wherein the first organic material comprises a small molecule or polymeric material.

12. The organic photosensitive device of claim 11, wherein the small molecule material comprises 3,4,9,10-dianhydride (PTCDA).

13. The organic photosensitive device of claim 11, wherein the small molecule material comprises copper phthalocyanine (CuPc).

14. The organic photosensitive device of claim 1, said layer having crystallinity of long range order of at least about 1.0 cm$^2$.

15. The organic photosensitive device of claim 1, said layer having crystallinity of long range order of at least about 4.0 cm$^2$.

* * * * *